(12) United States Patent
Sekiguchi

(10) Patent No.: US 7,234,789 B2
(45) Date of Patent: Jun. 26, 2007

(54) APPARATUS FOR EJECTING DROPLETS, ACTUATOR CONTROLLER USED IN THE APPARATUS, AND METHOD FOR CONTROLLING THE ACTUATOR

(75) Inventor: Yasuhiro Sekiguchi, Nagoya (JP)

(73) Assignee: Brother Kogyo Kabushiki Kaisha, Nagoya-shi (JP)

( * ) Notice: Subject to any disclaimer, the term of this patent is extended or adjusted under 35 U.S.C. 154(b) by 120 days.

(21) Appl. No.: 10/700,780

(22) Filed: Nov. 4, 2003

(65) Prior Publication Data

US 2004/0090476 A1 May 13, 2004

(30) Foreign Application Priority Data

Nov. 5, 2002 (JP) ............... 2002-320596

(51) Int. Cl.
*B41J 29/38* (2006.01)
*B41J 2/05* (2006.01)
(52) U.S. Cl. .............. 347/11; 347/57; 347/10
(58) Field of Classification Search .......... 347/10, 347/11, 57
See application file for complete search history.

(56) References Cited

U.S. PATENT DOCUMENTS

| 5,736,994 A * | 4/1998 | Takahashi .......... 347/11 |
| 6,099,103 A * | 8/2000 | Takahashi .......... 347/11 |
| 6,350,003 B1 | 2/2002 | Ishikawa |
| 6,412,896 B2 * | 7/2002 | Takahashi et al. ...... 347/11 |
| 6,457,818 B1 * | 10/2002 | Kurashima et al. ...... 347/71 |
| 6,705,696 B1 * | 3/2004 | Okuda et al. .......... 347/11 |
| 2001/0043241 A1 * | 11/2001 | Takahashi et al. ...... 347/10 |
| 2002/0186278 A1 * | 12/2002 | Nakamura et al. ...... 347/46 |
| 2003/0085962 A1 * | 5/2003 | Junhua .............. 347/68 |
| 2003/0179254 A1 | 9/2003 | Okuda |
| 2003/0184615 A1 * | 10/2003 | Wachtel ............ 347/46 |
| 2004/0061744 A1 * | 4/2004 | Hasenbein et al. ...... 347/76 |

FOREIGN PATENT DOCUMENTS

| JP | 11-227203 | 8/1999 |
| JP | 2001246746 | 9/2001 |
| JP | 2001-328259 | 11/2001 |
| JP | 11-1 70515 | 2/2002 |

* cited by examiner

*Primary Examiner*—Stephen Meier
*Assistant Examiner*—Rene Garcia, Jr.
(74) *Attorney, Agent, or Firm*—Reed Smith LLP

(57) ABSTRACT

In an apparatus for ejecting droplets having nozzles that eject droplets, liquid containing chambers each connected at one longitudinal end thereof with a corresponding nozzle, and an actuator that changes a volume of each of the liquid containing chamber, an ejection pulse signal and an additional pulse signal each increasing the volume of the liquid containing chamber are sequentially applied in accordance with a one-dot printing instruction. When the volume of the liquid containing chamber decreases upon completion of the application of the ejection pulse signal, liquid becomes protruding from the nozzle. The additional pulse signal is then applied to pull a tail portion of the liquid back toward the liquid containing chamber, thereby ejecting a fine droplet. A time interval between a completion of the application of the ejection pulse signal and a start of the application of the additional pulse signal are set at defined times.

27 Claims, 8 Drawing Sheets

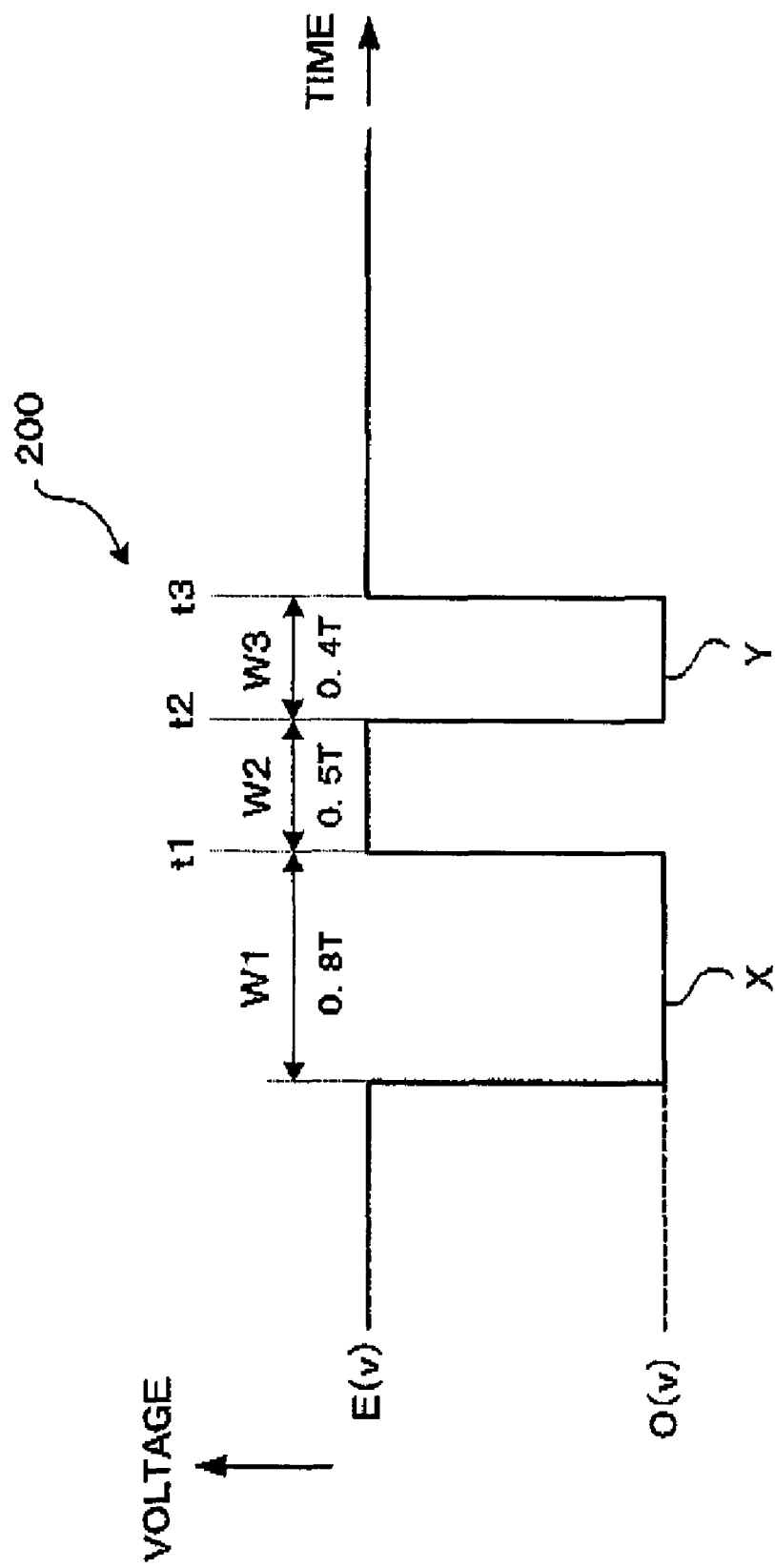

FIG. 7

| | | W1/T | | | | | | | | | | | |
|---|---|---|---|---|---|---|---|---|---|---|---|---|---|
| | | 0.44 | 0.49 | 0.53 | 0.58 | 0.62 | 0.67 | 0.71 | 0.76 | 0.80 | 0.84 | 0.89 | 0.93 | 0.98 |
| W2/T | 0.44 | × | × | × | × | × | △ | △ | △ | ◎ | ◎ | ◎ | ◎ | ◎ |
| | 0.49 | × | × | × | × | × | × | △ | ◎ | ◎ | ◎ | ◎ | ◎ | ○ |
| | 0.53 | × | × | × | × | △ | ◎ | ◎ | ◎ | ◎ | ◎ | ◎ | ○ | × |
| | 0.58 | × | × | △ | ○ | ◎ | ◎ | ◎ | ○ | ○ | ○ | ○ | × | × |
| | 0.62 | × | △ | ◎ | ◎ | ◎ | ○ | ◎ | △ | × | × | × | × | × |
| | 0.67 | △ | ○ | ◎ | ◎ | ◎ | ○ | △ | × | × | × | × | × | × |
| | 0.71 | △ | ◎ | ◎ | ◎ | ○ | △ | × | × | × | × | × | × | × |
| | 0.76 | ○ | ◎ | ◎ | ◎ | ○ | △ | × | × | × | × | × | × | × |
| | 0.80 | ◎ | ◎ | ○ | ○ | △ | × | × | × | × | × | × | × | × |
| | 0.84 | ◎ | ○ | × | × | × | × | × | × | × | × | × | × | × |
| | 0.89 | ◎ | × | × | × | × | × | × | × | × | × | × | × | × |

APPARATUS FOR EJECTING DROPLETS, ACTUATOR CONTROLLER USED IN THE APPARATUS, AND METHOD FOR CONTROLLING THE ACTUATOR

BACKGROUND OF THE INVENTION

1. Field of the Invention

The present invention relates to an apparatus for ejecting droplets capable of ejecting minute droplets, an actuator controller used in the apparatus, and a method for controlling the actuator.

2. Description of Related Art

A printing head in an inkjet printer includes therein an ink tank and pressure chambers. Each pressure chamber is supplied with ink from the ink tank. An actuator is arranged to correspond to each pressure chamber. When the actuator is driven to change a volume of a pressure chamber, ink in the pressure chamber is pressurized to be ejected through a nozzle connected with the pressure chamber. Particularly in order to eject minute droplets for high-resolution printing, there is known a technique, as disclosed in U.S. Pat. No. 6,350,003, in which an ejection pulse signal and an additional pulse signal accompanying the ejection pulse signal are sequentially applied to an actuator in accordance with a one-dot printing instruction.

According to the above technique, an application of the ejection pulse signal to the actuator increases the volume of a pressure chamber and ink is supplied to the pressure chamber from an ink tank. Then, when the application of the ejection pulse signal to the actuator completes, the volume of the pressure chamber decreases and ink protrudes from a nozzle. When the ink protruding from the nozzle is still connected with the nozzle and an ink droplet is going to be ejected, the additional pulse signal is applied to the actuator. Then, the volume of the pressure chamber again increases and a tail portion of the ink protruding from the nozzle is pulled back toward the pressure chamber, so that a part of the ink protruding from the nozzle other than the tail portion becomes apart from the nozzle to be ejected as an ink droplet. Like this, since the tail portion of the ink protruding from the nozzle to be ejected is pulled back toward the pressure chamber, an actually ejected ink droplet can be small in volume. Given that a time required for a pressure wave to propagate in one way longitudinally through the pressure chamber is T, a pulse width of the ejection pulse signal is set to be T, a pulse width of the additional pulse signal to be 0.2 T to 0.6 T, and a time interval between a completion of an application of the ejection pulse signal and a start of an application of the additional pulse signal to be 0.3 T to 0.7 T.

However, when each pulse signal is applied in accordance with the pulse width and the application timing as described above, an ejection speed of a droplet becomes relatively low. A low ejection speed of a droplet causes an unstable ejection to thereby deteriorate printing quality.

SUMMARY OF THE INVENTION

An object of the present invention is to provide an apparatus for ejecting droplets capable of stably ejecting minute droplets, an actuator controller used in the apparatus, and a method for controlling the actuator.

According to a first aspect of the present invention, there is provided an apparatus for ejecting droplets comprising: a plurality of nozzles through which droplets are ejected; a plurality of liquid containing chambers each connected at one longitudinal end thereof with a corresponding nozzle; an actuator that changes a volume of each of the liquid containing chambers; and an actuator controller that controls driving of the actuator, wherein: the actuator controller applies, in accordance with a one-dot printing instruction, to the actuator an ejection pulse signal that increases the volume of the liquid containing chamber to cause ejection of a droplet, and subsequently an additional pulse signal that increases the volume of the liquid containing chamber to pull back a part of the droplet about to be ejected; and a pulse width of the ejection pulse signal is A times a time T required for a pressure wave to propagate in one way longitudinally through the liquid containing chamber, where A is a positive constant less than 1.

According to a second aspect of the present invention, there is provided an actuator control device used in an apparatus for ejecting droplets, the apparatus comprising a plurality of nozzles through which droplets are ejected, a plurality of liquid containing chambers each connected at one longitudinal end thereof with a corresponding nozzle, and an actuator that changes a volume of each of the liquid containing chambers, the actuator control device applying, in accordance with a one-dot printing instruction, to the actuator an ejection pulse signal that increases the volume of the liquid containing chamber to cause ejection of a droplet, and subsequently an additional pulse signal that increases the volume of the liquid containing chamber to pull back a part of the droplet about to be ejected; and a pulse width of the ejection pulse signal being A times a time T required for a pressure wave to propagate in one way longitudinally through the liquid containing chamber, where A is a positive constant less than 1.

According to a third aspect of the present invention, there is provided a method for controlling an actuator in an apparatus for ejecting droplets, the apparatus comprising a plurality of nozzles through which droplets are ejected, a plurality of liquid containing chambers each connected at one longitudinal end thereof with a corresponding nozzle, and an actuator that changes a volume of each of the liquid containing chambers, the method comprising, with respect to a one-dot printing instruction, the steps of: applying to the actuator an ejection pulse signal having a pulse width of A times a time T required for a pressure wave to propagate in one way longitudinally through the liquid containing chamber, where A is a positive constant less than 1, the ejection pulse signal increasing the volume of the liquid containing chamber to cause ejection of a droplet; and applying to the actuator an additional pulse signal after the application of the ejection pulse signal, the additional pulse increasing the volume of the liquid containing chamber to pull back a part of the droplet about to be ejected.

According to the aforementioned first to third aspects, by setting the pulse width of the ejection pulse signal to be shorter than the time T required for a pressure wave to propagate in one way longitudinally through the liquid containing chamber, a volume of liquid to protrude from the nozzle on completion of the application of the ejection pulse signal can be reduced. Then, the application of the additional pulse signal pulls a part of the liquid protruding from the nozzle back toward the liquid containing chamber, so that a droplet to be actually ejected can have a further smaller volume than the volume of the liquid that has protruded from the nozzle. In this way, the above construction realizes an ejection of a minute droplet while it enables a droplet to be ejected at a relatively high speed, Thus, a stable ejection of minute droplets is realized.

BRIEF DESCRIPTION OF THE DRAWINGS

Other and further objects, features and advantages of the invention will appear more fully from the following description taken in connection with the accompanying drawings in which:

FIG. 5 schematically illustrates a pattern of a pulse waveform supplied to the ink-jet head;

FIG. 7 is a table showing results of experiments in which ink droplets were examined for ejection disorders depending on a change in a pulse waveform applied to an actuator unit.

DESCRIPTION OF THE PREFERRED EMBODIMENTS

Figure 1:
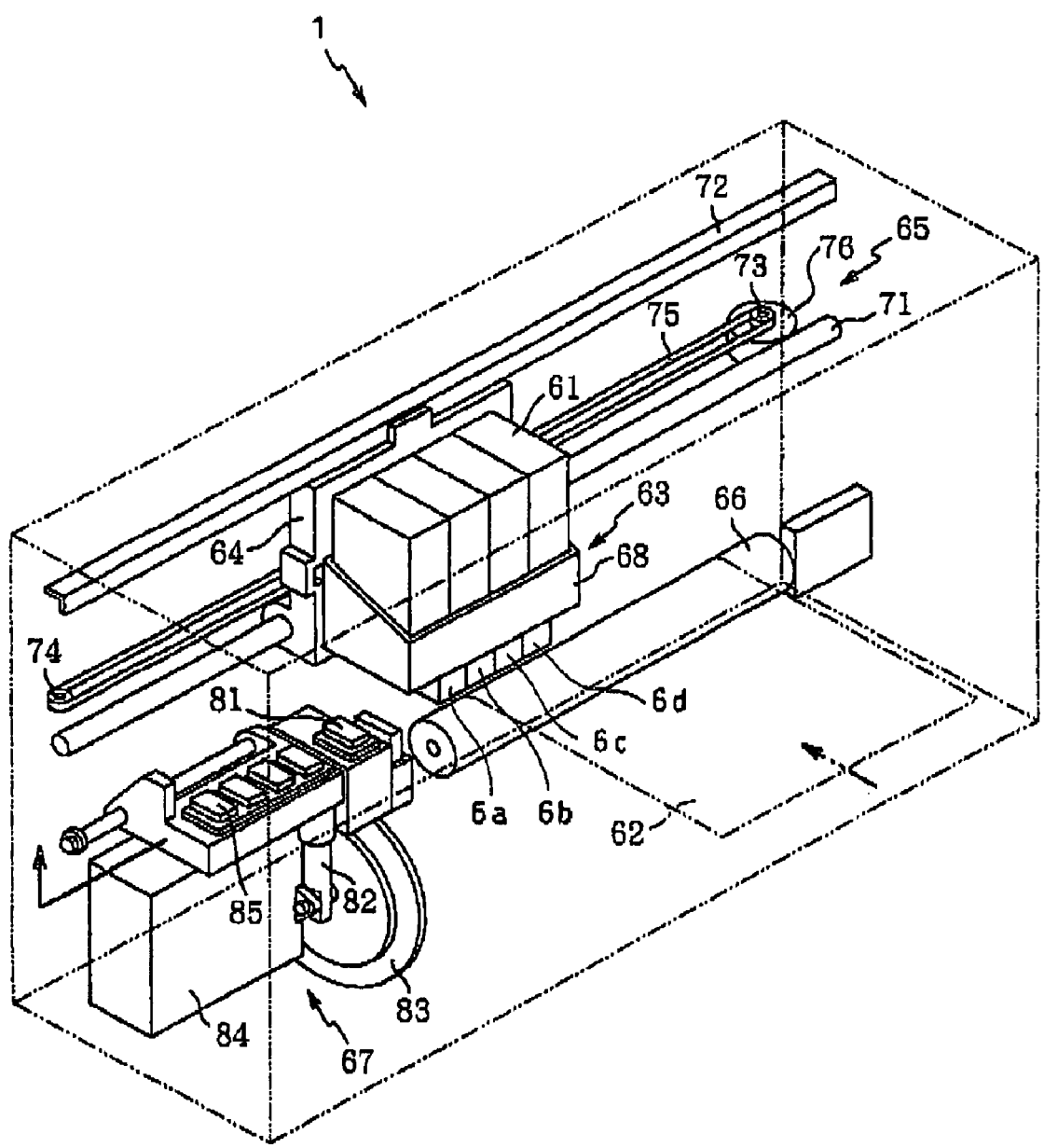
FIG. 1 is a schematic perspective view illustrating an internal structure of an ink-jet printer according to an embodiment of the present invention.

An internal structure of an ink-jet printer (an apparatus for ejecting droplets) according to an embodiment of the present invention will firstly be described with reference to FIG. 1. A head assembly 63 is arranged within an ink-jet printer 1. Four piezoelectric ink-jet heads 6a, 6b, 6c, and 6d for ejecting ink of yellow, magenta, cyan, and black, respectively, are fixed to a main frame 68 of the head assembly 63. Further, four ink cartridges 61 in total that are filled with the respective color ink are detachably attached to the main frame 68 of the head assembly 63. The main frame 68 of the head assembly 63 is fixed to a carriage 64 linearly reciprocated by a drive mechanism 65. A platen roller 66 for forwarding a paper is arranged with an axis thereof being in parallel with a reciprocating direction of the carriage 64. The platen roller 66 confronts the ink-jet heads 6a to 6d.

The carriage 64 is slidably supported by a guide shaft 71 and a guide plate 72 both disposed in parallel with the axis of the platen roller 66. Pulleys 73 and 74 are supported in vicinities of both ends of the guide shaft 71, and are spanned with a belt 75. The carriage 64 is fixed to the belt 75.

In the drive mechanism 65 thus constructed, when one pulley 73 reversibly rotates by a drive of a motor 76, the carriage 64 linearly reciprocates along the guide shaft 71 and the guide plate 72 so that the head assembly 63 also reciprocates accordingly.

A paper 62 is fed from a paper feed cassette (not illustrated) provided at one side of the ink-jet printer 1, then guided into a space between the ink-jet heads 6a to 6d and the platen roller 66, then subjected to a printing with ink ejected from the ink-jet heads 6a to 6d, and subsequently discharged from the ink-jet printer 1. Here, an illustration of mechanisms for feeding and discharging the paper 62 is omitted in FIG. 1.

On one side of the platen roller 66, provided is a purge system 67 for forcibly absorbing and removing defective ink containing bubbles or dust, etc., accumulated in the ink-jet heads 6a to 6d. A position of the purge system 67 is determined such that, when the drive mechanism 65 brings the head assembly 63 into a reset position, the purge system 67 may face any one of the four ink-jet heads 6a to 6d in order. The purge system 67 includes a purge cap 81 that is to be in contact with a lower face of any one of the ink-jet heads 6a to 6d so as to cover many nozzles 109 (see FIGS. 2 and 3) formed on the lower face of each of the ink-jet heads 6a to 6d.

With this structure, when the head assembly 63 is in the reset position, the nozzles 109 in any one of the ink-jet heads 6a to 6d are covered with the purge cap 81 and then, by driving a cam 83, a pump 82 absorbs defective ink with bubbles, etc., accumulated in the ink-jet head and discharges the ink into a waste-ink reservoir 84, as such performing a restoration of the ink-jet head. The four ink-jet heads 6a to 6d are sequentially subjected to this operation. Thus, bubbles can be removed at an initial stage of introducing ink into the ink-jet heads 6a to 6d, and also the ink-jet heads 6a to 6d can restore their normal state from a poor-ejection state caused by growth of bubbles therein, etc., accompanying a printing process.

The four caps 85 illustrated in FIG. 1 serve to prevent ink from becoming dry by covering the many nozzles 109 in the corresponding ink-jet heads 6a to 6d on the carriage 64 having returned to the reset position after printings.

Figure 2:
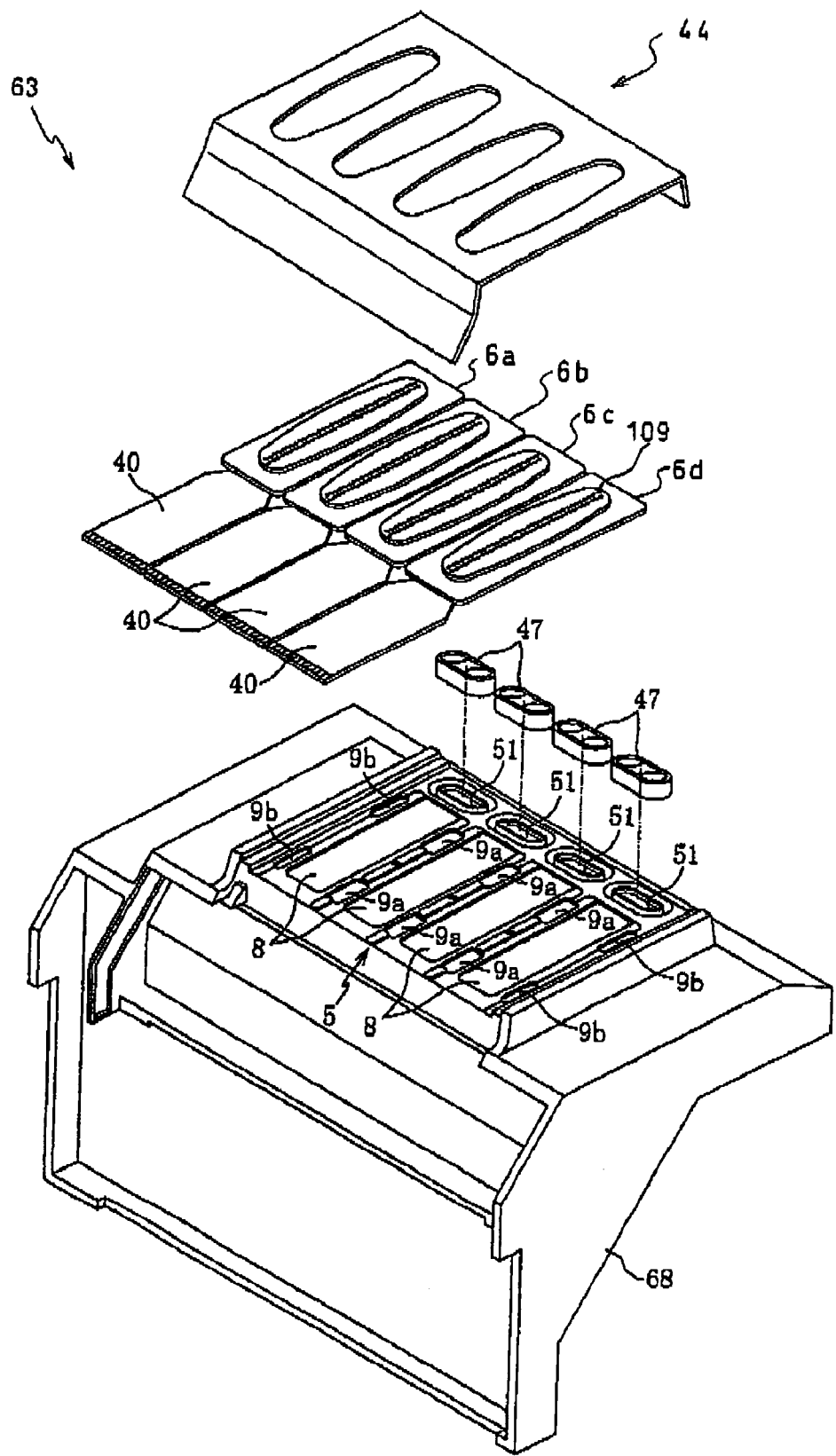
FIG. 2 is an exploded perspective view of an inverted head assembly included in the ink-jet printer of FIG. 1.

FIG. 2 is an exploded perspective view of an inverted head assembly 63 included in the ink-jet printer 1 of FIG. 1. The main frame 68 of the head assembly 63 is shaped into nearly a box with a top face thereof (which faces downward in FIG. 2) being opened, and is formed with a mounting portion for detachably mounting, from the forgoing opening side, the four ink cartridges 61 illustrated in FIG. 1.

In one side part of the mounting portion of the main frame 68, formed are four ink supply passages 51 each extending from a lower face (i.e., a face to which the ink-jet heads 6a to 6d are fixed and which faces upward in FIG. 2) of a bottom plate 5 of the main frame 68 toward an upper face thereof. The ink supply passages 51 are capable of being connected with ink discharging portions of the respective ink cartridge 61. Joint members 47 made of rubber, etc., are attached to the lower face of the bottom plate 5 to correspond to the respective ink supply passage 51 such that each joint member 47 may be in close contact with an ink supply port (not illustrated) of each of the ink-jet heads 6a to 6d.

The bottom plate 5 is provided on the lower face side thereof with four support portions 8 each formed into a stepped recess for arranging in parallel the four ink-jet heads 6a to 6d. Each support portion 8 is formed with several blank spaces 9a and 9b penetrating in a vertical direction and used for fixing the corresponding ink-jet heads 6a to 6d with a UV adhesive.

The ink-jet heads 6a to 6d supported on the support portions 8 on the bottom plate 5 are covered with a covering member 44 having openings each corresponding to a region entirely enclosing the many nozzles 109. A flexible printed circuit (FPC) 40, for applying later-described pulse waveform signals (including an ejection pulse signal and an additional pulse signal and taking selectively one of the ground potential and a predetermined positive potential) to each of the ink-jet heads 6a to 6d, is attached to each of the ink-jet heads 6a to 6d.

Figure 3:
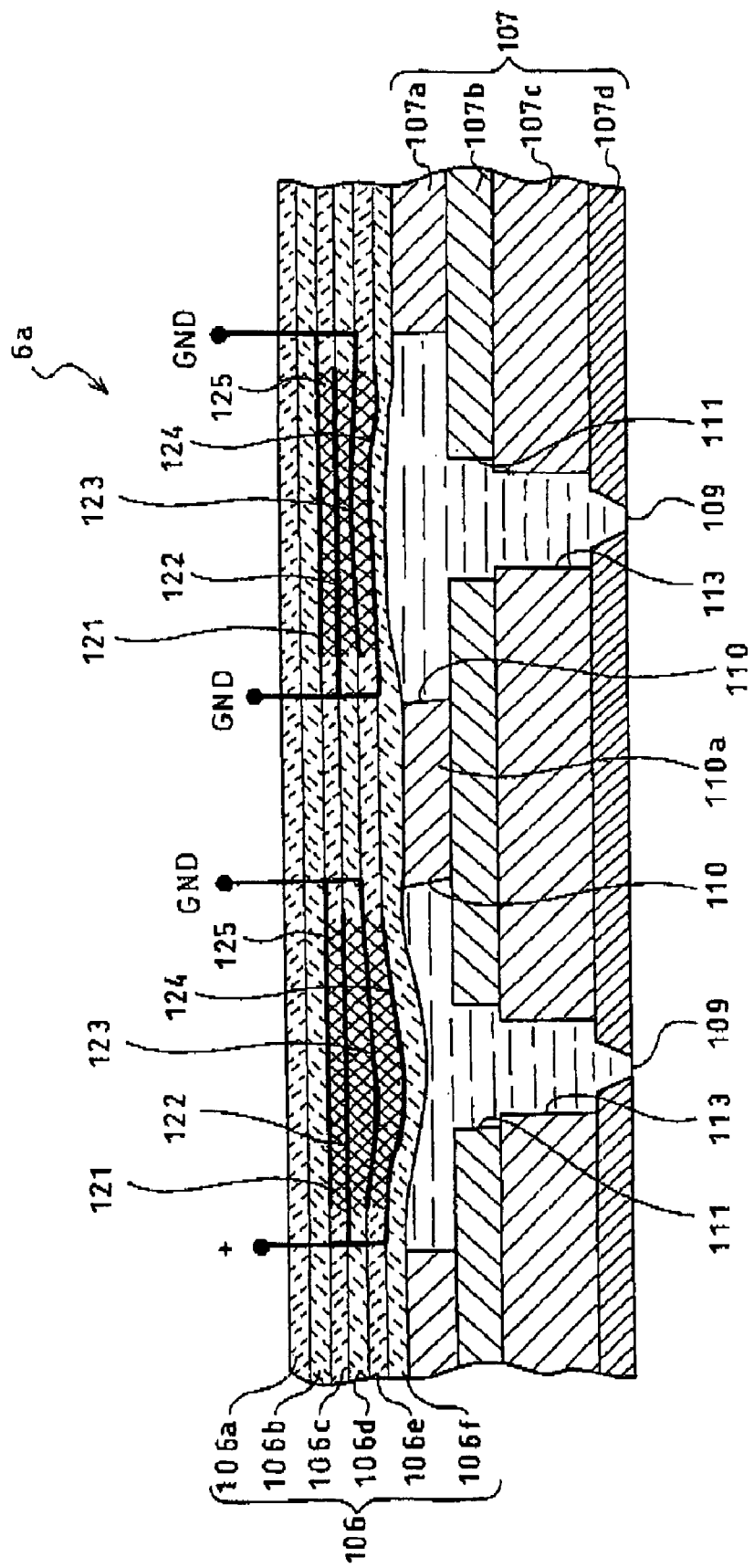
FIG. 3 is a partial sectional view taken along a lateral direction of a pressure chamber in an ink-jet head included in the ink-jet printer of FIG. 1.
Figure 4:
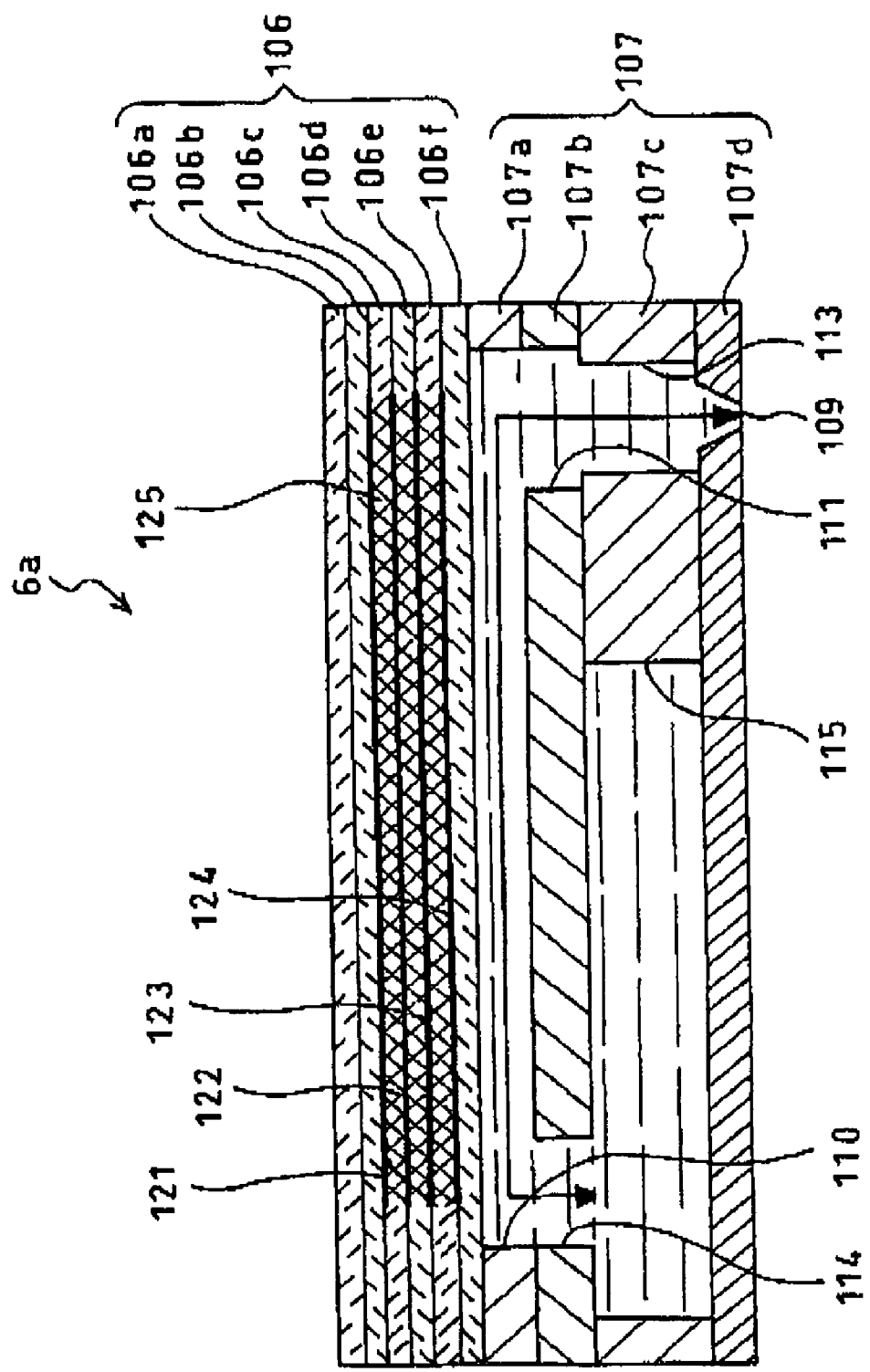
FIG. 4 is a partial sectional view taken along a longitudinal direction of the pressure chamber in the ink-jet head included in the ink-jet printer of FIG. 1.
Figure 6A:
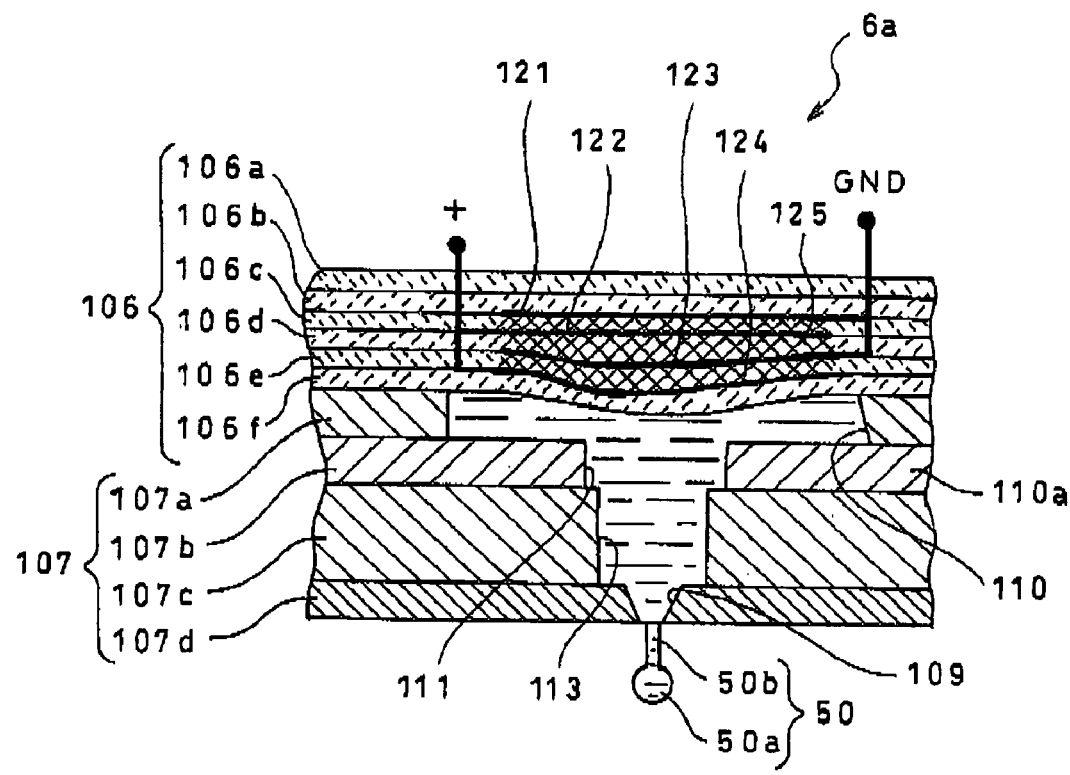
FIG. 6A is a partial sectional view showing a state where ink is protruding from a nozzle.
Figure 6B:
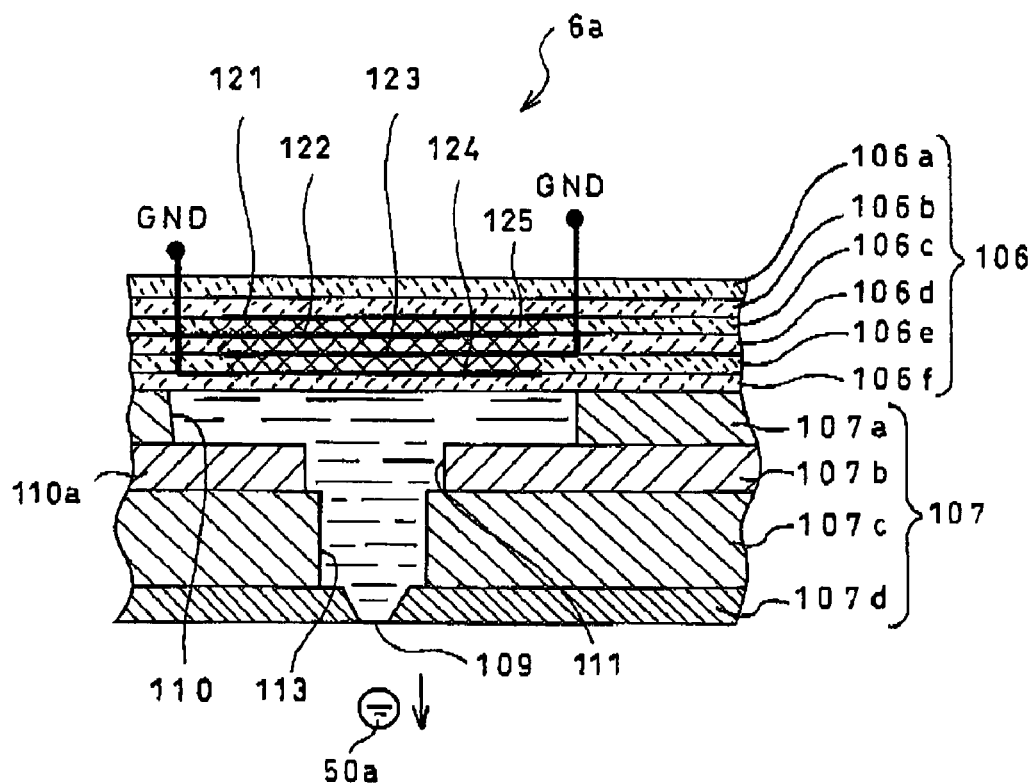
FIG. 6B is a partial sectional view showing a state where an ink droplet has just been ejected from the nozzle.

A construction of the ink-jet head 6a included in the ink-jet printer 1 of FIG. 1 will then be described with reference to FIGS. 3 and 4. FIGS. 3 and 4 are partial sectional views taken along a lateral and longitudinal directions, respectively, of a pressure chamber in the ink-jet head 6a included in the ink-jet printer 1 of FIG. 1. The same construction as that of the ink-jet head 6a is to be applied to the other three ink-jet heads 6b to 6d, and accordingly descriptions thereof will be omitted. In this embodiment, the ink-jet head 6a ejects ink of yellow (Y), the ink-jet head 6b ejects ink of magenta (M), the ink-jet head 6c ejects ink of cyan (C), and the ink-jet head 6d ejects ink of black (K).

The ink-jet head 6a is constructed by an actuator unit 106 and a passage unit 107 being laminated with each other. The actuator unit 106 is driven by a pulse waveform signal generated in a controller (actuator controller or actuator control device) 11 (see FIG. 8) as will be described later. The passage unit 107 is formed therein with an ink passage. The actuator unit 106 and the passage unit 107 are bonded to each other with an epoxy-base thermosetting adhesive. Although the FPC 40 illustrated in FIG. 2 is bonded to an upper face of the actuator unit 106, FIGS. 3 and 4 do not illustrate the FPC 40 for simplification.

The passage unit 107 is constructed by laminating three metal thin plates (i.e., a cavity plate 107a, a spacer plate 107b, and a manifold plate 107c) and a nozzle plate 107d made of a synthetic resin such as polyimide having nozzles 109 that eject ink. The uppermost cavity plate 107a is bonded to the actuator unit 106.

In the cavity plate 107a, pressure chambers 110 are formed in two lines along a longitudinal direction. As illustrated in FIG. 3, the pressure chambers 110 are separated from each other by a partition 110a and arranged with a longitudinal direction thereof being in parallel with each other. The spacer plate 107b is formed with a communication hole 111 for communicating one end of a pressure chamber 110 with a nozzle 109, and a communication hole 114 for communicating the other end of the pressure chamber with a manifold channel 115 of FIG. 4.

As illustrated in FIG. 4, the manifold plate 107c is formed with a communication hole 113 for communicating one end of a pressure chamber 110 with a nozzle 109, and a manifold channel 115 for supplying ink to each pressure chamber 110. One end of the manifold channel 115 is connected to the ink cartridge 61 through the ink supply passage 51 illustrated in FIG. 2. Thereby formed is an ink passage extending from the manifold channel 115 through the communication hole 114, the pressure chamber 110, and the communication holes 111 and 113, to the nozzle 109.

The actuator unit 106 is, on the other hand, constructed by laminating six piezoelectric ceramic plates 106a to 106f made of a lead zirconate titanate (PZT) ceramic material. Common electrodes 121 and 123 are provided between the piezoelectric ceramic plates 106b and 106c and between the piezoelectric ceramic plates 106d and 106e, respectively. Each of the common electrodes 121 and 123 is arranged only in an area above the corresponding pressure chamber 110 of the passage unit 107. On the other hand, individual electrodes 122 and 124 are provided between the piezoelectric ceramic plates 106c and 106d and between the piezoelectric ceramic plates 106e and 106f, respectively. Each of the individual electrodes 122 and 124 is arranged only in an area above the corresponding pressure chamber 110 of the passage unit 107.

As shown in FIG. 3, the common electrodes 121 and 123 are always kept at the ground potential. On the other hand, the individual electrodes 122 and 124 take selectively one of the ground potential and a predetermined positive potential by being applied with a pulse waveform signal as will be described later. Regions of the piezoelectric ceramic plates 106c to 106e sandwiched between the common electrodes 121, 123 and the individual electrodes 122, 124 are made into active portions 125 polarized in their thickness direction by being applied with an electric field in advance by these electrodes.

A deformation of the actuator unit 106 will here be described with reference to FIG. 3. In this embodiment, when the individual electrodes 122 and 124 are set at a predetermined positive potential, the actuator unit 106 bends convexly toward the pressure chamber 110 side, as shown on the left of FIG. 3. More specifically, the active portions 125 of the piezoelectric ceramic plates 106c to 106e are going to expand in their thickness direction by the application of the electric field, whereas the piezoelectric ceramic plates 106a and 106b do not exhibit such a phenomenon, Accordingly, portions of the actuator unit 106 corresponding to the active portions 125, as a whole, swell up to expand toward the pressure chamber 110 side. At this time, the pressure chamber 110 is smaller in volume in comparison with a state where each of the plates 106a to 106f of the actuator unit 106 lies flat.

On the other hand, the individual electrodes 122 and 124 on the right of FIG. 3 are, similarly to the common electrodes 121 and 123, kept at the ground potential. At this time, the actuator unit 106 is, although should be substantially flat, slightly concave toward the pressure chamber 110 side because of so-called cross-talk that is caused by change of the volume of the adjacent pressure chamber 110.

FIG. 5 illustrates a fundamental unit, to be applied in accordance with a one-dot printing instruction, of a pulse waveform 200 adopted for forming a minute droplet, among kinds of waveform pattern of a pulse signal stored in a waveform memory 24 (see FIG. 8) as will be described later. The fundamental unit of the pulse waveform 200 comprises two signals, i.e., an ejection pulse signal X and an additional pulse signal Y, which are sequentially applied with a time interval W2 interposed therebetween. The additional pulse signal Y is for forming a minute droplet, and in other words, the present invention is adopted to form a minute droplet. When the two of the ejection pulse signal X and the additional pulse signal Y are applied, the individual electrodes 122 and 124 are kept at the ground potential (0 (V)), and when these signals are not applied, the individual electrodes 122 and 124 are kept at a predetermined positive potential E (V), e.g., 20 (V).

Here, when a time required for a pressure wave to propagate in one way through a section within the passage unit 107 indicated by an arrow in FIG. 4 is defined as T (e.g., 4.5 μsec in this embodiment), a pulse width W1 of the ejection pulse signal X, a time interval W2 between a completion of the application of the ejection pulse signal X and a start of the application of the additional pulse signal Y, and a pulse width W3 of the additional pulse signal Y are set to be 0.8 times, 0.5 times, and 0.4 times the aforementioned time T, respectively, as shown in FIG. 5. In this embodiment, the foregoing arrowed section is a section extending from a boundary between the manifold channel 115 and the communication hole 114, i.e., a lower face of the spacer plate 107b, longitudinally through the pressure chamber 110, to the nozzle 109.

Next, an ink ejection in the ink-jet heads 6a to 6d will be described with reference to FIGS. 3 to 5 and FIGS. 6A and 6B. This embodiment adopts a method of so-called "fill before fire" in which pressures generated in the pressure chamber 110 are superimposed on each other so as to obtain a high ink ejection speed using a relatively small drive voltage. This embodiment also adopts a method in which, in order to reduce a size of an ink droplet, the main ejection pulse signal X is applied and then the additional pulse signal Y is applied. Although a description of the ink-jet head 5a will be given below, the description is also applicable to the other ink-jet heads 6b to 6d.

At first, when neither the ejection pulse signal X nor the additional pulse signal Y is applied, i.e., in a normal condition, all the individual electrodes 122 and 124 are kept at a predetermined positive potential E (V) and the actuator unit 106 bends convexly toward the pressure chamber 110 to reduce volumes of all the pressure chambers 110. At this time, ink in the passage unit 107 is held in the ink passages leading to the nozzles 109, without protruding nor being ejected from the nozzles 109.

Then, at an appropriate timing, the ejection pulse signal X is applied to individual electrodes 122 and 124 corresponding to a pressure chamber 110 to be used for ink ejection, to set those individual electrodes 122 and 124 at the voltage value 0 (V) Thereby, the actuator unit 106 becomes substantially flat and the pressure chamber 110 becomes larger in volume than in the normal condition. At this time, in the passage unit 107, ink is supplied from the manifold channel 115 (see FIG. 4) through the communication hole 114 to the pressure chamber 110. At the same time, a pressure wave is generated in the pressure chamber 110 and propagates through the arrowed section within the passage unit 107.

The application of the ejection pulse signal X continues for the time period W1 (i.e., 0.8 T) When the application completes, the individual electrodes 122 and 124, which have been kept at 0 (V), restore the same predetermined positive potential E (V) as in the normal condition. Thus, the volume of the pressure chamber 110 is reduced again. When the application of the ejection pulse signal X completes (at a point t1 in FIG. 5 that is a rise timing on the right side of the ejection pulse signal X), the volume of the pressure chamber 110 suddenly changes from the increased state into the initial state. Therefore, a pressure caused by the actuator unit 106 to reduce the volume of the pressure chamber 110 is superimposed on a pressure generated when the pressure wave of ink is reversed into a positive pressure, Thereby, ink protrudes from a nozzle 109 communicating with this pressure chamber 110 (see FIG. 6A). Ink 50 protruding from the nozzle 109 includes a spherical portion 50a at a front thereof and a tail portion 50b connected to the nozzle 109. That is, at this time, an ink droplet is about to be ejected.

Subsequently, after the time interval W2 (i.e., 0.5 T) has elapsed since the application of the ejection pulse signal X completed (the point t1 in FIG. 5 that is the rise timing on the right side of the ejection pulse signal X), the additional pulse signal Y is applied. Thereby, those individual electrodes 122 and 124, i.e., the individual electrodes 122 and 124 which have already be n applied with the ejection pulse signal X are again set at the voltage value 0 (V), so that the volume of the pressure chamber 110 is increased. At this time, that is, at a point t2 in FIG. 5 (a fall timing on the left side of the additional pulse signal Y), an inside of the pressure chamber 110 becomes under a negative pressure, Therefore, the tail portion 50b of the ink 50 protruding from the nozzle 109 is pulled back toward the pressure chamber 110. Thus, a portion protruding from the nozzle 109 other than the tail portion 50b, i.e., the spherical portion 50a becomes separated from the nozzle 109 and is ejected as an ink droplet (see FIG. 6B). Here, a volume of the ink droplet ejected from the nozzle 109, i.e., a volume of the spherical portion 50a is further smaller than a volume of the ink 50 that became protruding from the nozzle 109 when the application of the ejection pulse signal X completed (at the rise timing on the right side of the ejection pulse signal X in FIG. 5).

The application of the additional pulse signal Y continues for the time period W3 (i.e., 0.4 T). When the application of the additional pulse signal Y completes (at a point t3 in FIG. 5 that is a rise timing on the right side of the additional pulse signal Y), any other ink droplet is never ejected from the nozzle 109. After the applications of these two pulse signals X and Y, the normal condition where the volume of the pressure chamber 110 is reduced is restored.

Here, with the ink-jet printer according to the aforementioned embodiment, ink droplets were examined for ejection disorders in accordance with a change in the pulse width W1 of the ejection pulse signal X and a change in the time interval W2 between the completion of the application of the ejection pulse signal X and the start of the application of the additional pulse signal Y. This examination was conducted under a condition that a temperature of ink is 40 degrees C., the time T required for a pressure wave to propagate in one way through the arrowed section within the passage unit 107 is 4.5 μsec, and the pulse width W3 of the additional pulse signal Y is 2.0 μsec (i.e., approximately 0.44 times the time T).

FIG. 7 shows these examination results. Values (W1/T) obtained by dividing by the time T the pulse width W1 of the ejection pulse signal X, and values (W2/T) obtained by dividing by the time T the time interval W2 between the completion of the application of the ejection pulse signal X and the start of the application of the additional pulse signal Y are arranged along a longitudinal direction and a lateral direction, respectively, of a table of FIG. 7. Many ink droplets adhering onto a paper in each case were observed, When any disorder was found, the disorder was evaluated in accordance with its degree and classified into any one of three stages denoted by a cross (×), a triangle (Δ), and a circle (○), respectively, in this order from a poorer degree. A case where no disorders were found is denoted by a double circle (◎).

FIG. 7 shows that double circles concentrate in vicinities of an axis extending from the lower left to the upper right of the table, and the evaluation results become poorer as they get distant from the axis. Although FIG. 7 does not show a case where the value W1/T in the lateral direction is 1.0 or more, it can be assumed, from the distribution of the double circles, that a state denoted by a double circle is not obtained when the value W1/T is 1.0 or more with the value W2/T being within the range shown in the table (0.44 to 0.89). In fact, a state denoted by a double circle was not obtained in an experiment in which the value W1/T was set at 1.02. When the value W1/T is less than 1.0, on the contrary, a printing result with high quality may be obtained by setting W2/T at a proper value.

More specifically, a state denoted by a double circle was obtained when a total value of W1/T and W2/T is in a range of 1.1 to 1.5. Accordingly, a high-quality printing with little disorder of droplets can be realized by setting within the above range the pulse width W1 of the ejection pulse signal X and the time interval W2 between the completion of the application of the ejection pulse signal X and the start of the application of the additional pulse signal Y.

Figure 8:
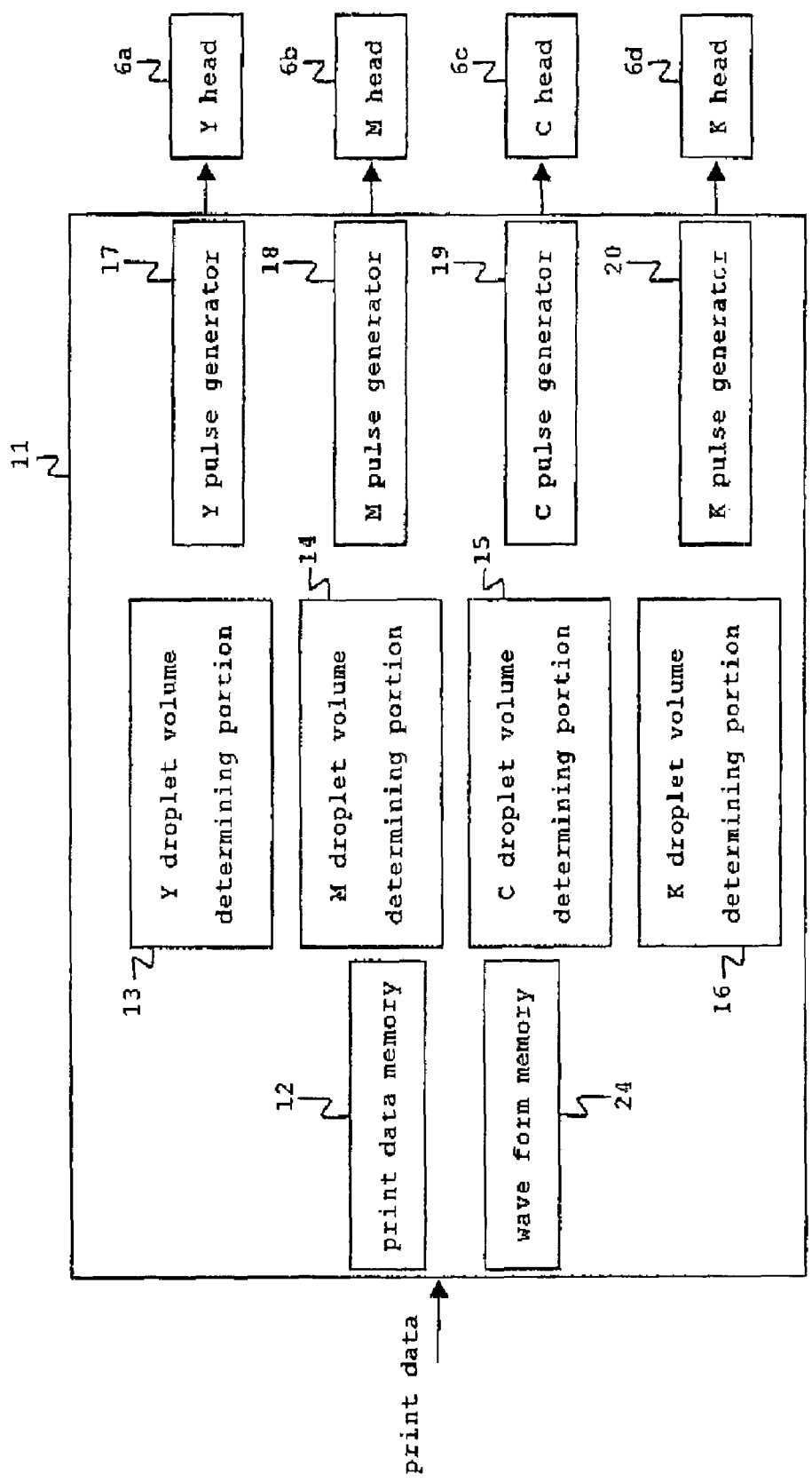
FIG. 8 is a block diagram of an electrical construction of the inkjet printer of FIG. 1.

Next, a control of the ink-jet heads 6a to 6d will be described with reference to a block diagram of FIG. 8.

A controller 11 includes a print data memory 12 that stores print data supplied from an outside such as a personal computer. The print data memory 12 stores, as print data, bitmap data of a gradation value of each pixel (8 bits; 256 gradations) included in image data, corresponding to the respective colors of Y, M, C, and K. The controller 11 further includes a waveform memory 24. The waveform memory 24 stores plural waveform patterns of pulse signals in accordance with a volume of a droplet to be ejected upon a one-dot printing instruction. The waveform patterns of pulse signals are to be supplied to the individual electrodes 122 and 124 of the actuator unit 106 in ejecting an ink droplet.

The waveform memory 24 of this embodiment stores four patterns of the pulse waveforms corresponding to four values of total volumes of ink, i.e., a large droplet (45 pl), a medium droplet (30 pl), a small droplet (15 pl), and a minute droplet (8 pl). More specifically, the pulse waveform 200 in FIG. 5 of the present invention is adopted to form a minute droplet, while large, medium, and small droplets are formed by varying a dot size by, as publicly known, changing the number of ejection pulse signals so as to thereby change the number of ink droplets to be combined with each other on a paper.

The controller 11 has, in addition, droplet volume determining portions 13, 14, 15, and 16 corresponding to the colors of Y, M, C, and K, respectively. Each of the droplet volume determining portions 13 to 16 determines which one of five kinds of volumes, i.e., a large droplet, a medium droplet, a small droplet, a minute droplet, and no ejection, is to be adopted as a volume of an ink droplet of each color ejected from each nozzle of the ink-jet heads 6a to 6d to correspond to one dot on a paper. This determination is given on the basis of a gradation value of each color for each pixel directed to a printing, which is stored in the print data memory 12.

Further, the controller 11 has pulse generators 17, 18, 19, and 20 corresponding to the colors of Y, M, C, and K, respectively. Each of the pulse generators 17 to 20 generates a pulse waveform signal to be supplied to each of the ink-jet heads 6a to 6d with reference to the pulse waveforms stored in the waveform memory 24 such that the nozzle 109 may eject an ink droplet, as corresponding to one dot on a paper, having a total volume determined by the corresponding one of droplet volume determining portions 13 to 16. The pulse waveform signals generated in the pulse generators 17 to 20 are supplied to the corresponding ink-jet heads 6a to 6d.

Each part in the controller 11 comprises not-illustrated members such as CPU, RAM, and ROM. The ROM stores, in addition to the waveform memory 24 storing the aforementioned pulse waveforms, software such as programs and data for operating the controller 11.

As described above, according to the ink-jet printer 1 of this embodiment, in the case of applying the pulse waveform 200 for forming a minute droplet, the pulse width W1 of the ejection pulse signal X is set to be 0.8 T, which is less than the time T required for a pressure wave to propagate in one way through the arrowed section within the passage unit 107 as illustrated in FIG. 4. Therefore, the ink 50, which becomes protruding from the nozzle 109 upon completion of the application of the ejection pulse signal X, can be reduced in volume in comparison with a case where the pulse width W1 is set to be not less than the time T. The application of the additional pulse signal Y pulls the tail portion 50b of the ink 50 protruding from the nozzle 109 back toward the pressure chamber 110, so that the volume of the ink droplet to be actually ejected becomes further smaller than the volume of the ink 50 that has protruded from the nozzle 109. In this way, the above construction can eject a minute droplet while it enables a droplet to be ejected at a relatively high speed. Thus, a stable ejection of minute droplets is realized.

Further, the total value (W1+W2) of the pulse width W1 of the ejection pulse signal X and the time interval W2 between the completion of the application of the ejection pulse signal X and the start of the application of the additional pulse signal Y is 1.3 times the time T (see FIG. 5), which is within the range of 1.1 to 1.5 described above with reference to the experiment results in FIG. 7. Therefore, the volume of the ink droplet to be ejected can be reduced more reliably.

Still further, since the pulse width W3 of the additional pulse signal Y is 0.4 times the time T (see FIG. 5), the tail portion of the ink, which becomes protruding from the nozzle 109 upon completion of the application of the ejection pulse signal X, can be effectively pulled back toward the pressure chamber 110, so that the portion protruding from the nozzle 109 other than the tail portion, i.e., the ink droplet to be ejected can more reliably be reduced in volume.

In this embodiment, moreover, the time T is 4.5 μsec and the foregoing effects can more reliably be obtained by properly setting the aforementioned conditions (such as the pulse width W1 of the ejection pulse signal X and the time interval W2 between the completion of the application of the ejection pulse signal x and the start of the application of the additional pulse signal Y, etc.).

Although the ink-jet printer 1 of the above-described embodiment has the four ink-jet heads 6a to 6d, the head is not limited in number as far as at least one head is provided.

In the actuator unit 106 in each of the heads 6a to 6d, the active portions 125 may bend in a reverse direction. Also, the actuator unit 106 may be a shear mode type that generates a so-called piezoelectric shear deformation in the thickness, instead of the one in which piezoelectric elements are put in layer in their thickness direction. Additionally, an actuator made of various materials, without limiting to the piezoelectric material, may be adopted as far as that actuator can change a volume of the pressure chamber 110, Although, in the pulse waveform of the aforementioned embodiment, the potential of the common electrodes is set at 0 (V), this is not limitative.

Moreover, although the time T required for a pressure wave to propagate in one way through the arrowed section within the passage unit 107 illustrated in FIG. 4 is preferably set at 5 μsec or less (e.g., 4.5 μsec as in the above embodiment) which may cope with printing at a high frequency, this is not limitative.

In the aforementioned embodiment, since no restriction is formed between the pressure chamber 110 and the manifold channel 115 serving as an ink supply source thereof, "a space from an end of the manifold channel 115 on the pressure chamber 110 side to the nozzle 109" is regarded as a liquid containing chamber of the present invention, and the time required for a pressure wave to propagate in one way through the arrowed section in FIG. 4 is defined as T. In a case where a restriction is formed, on the other hand, "a space from an end of the restriction on the pressure chamber 110 side to the nozzle 109" is regarded as a liquid containing chamber of the present invention, and the time required for a pressure wave to propagate in one way through this section is defined as T.

The present invention is not limited to a serial-type printer as in the above embodiment, and it is applicable to a line-type printer as well. An apparatus for ejecting droplets constructed similarly to the ink-jet printer of the above-described embodiment may eject droplets of a conductive paste so as to print a very minute electric circuit pattern. Further, an apparatus for ejecting droplets constructed similarly to the ink-jet printer of the above-described embodiment may eject droplets of an organic luminescent material to make a high-resolution display device such as an organic electroluminescence display (OELD). Otherwise, in applications for forming minute dots on a print medium, an apparatus for ejecting droplets constructed similarly to the ink-jet printer of the above-described embodiment can be used very widely. The present invention is, for example, applicable also to inkjet type facsimiles and copying machines.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. An apparatus for ejecting droplets comprising:
   a plurality of nozzles through which droplets are ejected;
   a plurality of liquid containing chambers each connected at one longitudinal end thereof with a corresponding nozzle;
   an actuator that changes a volume of each of the liquid containing chambers; and
   an actuator controller that controls driving of the actuator, wherein:
   the actuator controller applies, in accordance with a one-dot printing instruction, to the actuator an ejection pulse signal that increases the volume of the liquid containing chamber to cause ejection of a droplet, and subsequently only one additional pulse signal that increases the volume of the liquid containing chamber to pull back a part of the droplet about to be ejected; and
   a pulse width of the ejection pulse signal is A times a time T required for a pressure wave to propagate in one way longitudinally through the liquid containing chamber, where A is a positive constant less than 1,
   wherein the ejection pulse and the only one additional pulse signal generates a stable ejection of minute droplets.

2. The apparatus according to claim 1, wherein a time interval between a completion of an application of the ejection pulse signal and a start of an application of the additional pulse signal is B times the time T, where B is a positive constant; and a total value of the constants A and B is 1.15 to 1.38.

3. The apparatus according to claim 2, wherein a pulse width of the additional pulse signal is C times the time T, where C is a constant within 0.4 to 0.5.

4. The apparatus according to claim 2, wherein the total value of the constants A and B is 1.21 to 1.33.

5. The apparatus according to claim 1, wherein the time T is 5 μsec or less.

6. The apparatus according to claim 1, wherein each of the liquid containing chambers includes a pressure chamber connected at one longitudinal end thereof with a corresponding nozzle and at the other end thereof with a ink supply source, a volume of the pressure chamber being changed by the actuator, and
   wherein the liquid containing chamber is a space from an end portion of the ink supply source on the pressure chamber side, through the pressure chamber, to the nozzle.

7. The apparatus according to claim 6, wherein the actuator has a face confronting the plurality of liquid containing chambers, and changes a volume of each of the liquid containing chambers by changing its state between a state where the face confronting the plurality of liquid containing chambers is flat and a state where the face confronting the plurality of liquid containing chambers is bent; and
   the nozzle is formed in such a manner that an ink droplet can be ejected through the nozzle in a direction parallel to a direction in which the face of the actuator confronting the liquid containing chambers is bent when the actuator controller applies the ejection pulse signal to the actuator.

8. The apparatus according to claim 7, wherein the pressure chambers extend along a direction perpendicular to the direction in which an ink droplet is ejected through the nozzle.

9. The apparatus according to claim 8, wherein the ink supply source extends such that the pressure chambers can be sandwiched between the ink supply source and the actuator.

10. The apparatus according to claim 7, wherein the face of the actuator controlling the fluid containing chambers include only one of inner walls that define the pressure chamber.

11. The apparatus according to claim 7, wherein the plurality of liquid containing chambers are uniformly arranged along a direction perpendicular to the direction in which an ink droplet is ejected through the nozzle; and
    the actuator extends over the plurality of liquid containing chambers along the direction in which the plurality of liquid containing chambers are arranged.

12. The apparatus according to claim 11, wherein the chamber is formed of a piezoelectric actuator having a plurality of laminated piezoelectric layers.

13. The apparatus according to claim 1, wherein the actuator controller stores plural waveform patterns of pulse signals being applied to the actuator in accordance with a volume of a droplet to be ejected upon a one-dot printing instruction, selects any one of the plural waveform patterns in accordance with a gradation value of each pixel included in image data, and, upon selection of a waveform pattern for a minute droplet out of the plural waveform patterns, applies the ejection pulse signal and subsequently the additional pulse signal to the actuator.

14. An actuator control device used in an apparatus for ejecting droplets, the apparatus comprising a plurality of nozzles through which droplets are ejected, a plurality of liquid containing chambers each connected at one longitudinal end thereof with a corresponding nozzle, and an actuator that changes a volume of each of the liquid containing chambers,
    the actuator control device applying, in accordance with a one-dot printing instruction, to the actuator an ejection pulse signal that increases the volume of the liquid containing chamber to cause ejection of a droplet, and subsequently an additional pulse signal that increases the volume of the liquid containing chamber to pull back a part of the droplet about to be ejected; and
    a pulse width of the ejection pulse signal being A times a time T required for a pressure wave to propagate in one way longitudinally through the liquid containing chamber, where A is a positive constant less than 1,
    wherein the ejection pulse and the only one additional pulse signal generates a stable ejection of minute droplets.

15. The actuator control device according to claim 14, wherein a time interval between a completion of an application of the ejection pulse signal and a start of an application of the additional pulse signal is B times the time T, where B is a positive constant; and a total value of the constants A and B is 1.15 to 1.38.

16. The actuator control device according to claim 15, wherein a pulse width of the additional pulse signal is C times the time T, where C is a constant within 0.4 to 0.5.

17. The actuator control device according to claim 15, wherein the total value of the constants A and B is 1.21 to 1.33.

18. The actuator control device according to claim 14, wherein the time T is 5 μsec or less.

19. The actuator control device according to claim 14, wherein each of the liquid containing chambers includes a pressure chamber connected at one longitudinal end thereof with a corresponding nozzle and at the other end thereof with a ink supply source, a volume of the pressure chamber being changed by the actuator, and
wherein the liquid containing chamber is a space from an end portion of the ink supply source on the pressure chamber side, through the pressure chamber, to the nozzle.

20. The actuator control device according to claim 14, wherein the device stores plural waveform patterns of pulse signals being applied to the actuator in accordance with a volume of a droplet to be elected upon a one-dot printing instruction, selects any one of the plural waveform patterns in accordance with a gradation value of each pixel included in image data, and, upon selection of a waveform pattern for a minute droplet out of the plural waveform patterns, applies the ejection pulse signal and subsequently the additional pulse signal to the actuator.

21. An actuator control device comprising:
a print data memory that stores a gradation value of each pixel included in image data;
a waveform memory that stores plural waveform patterns of pulse signals that correspond to different volumes of a droplet to be ejected upon a one-dot printing instruction;
a droplet volume determining portion that determines, with respect to each pixel, a volume of a droplet to be ejected from a nozzle, on the basis of the gradation value stored in the print data memory; and
a pulse generator that generates a pulse signal to be applied to an actuator that changes a volume of a liquid containing chamber on the basis of any one of the plural waveform patterns corresponding to the volume of a droplet determined by the droplet volume determining portion,
wherein one of the plural waveform patterns stored in the waveform memory includes:
an ejection pulse signal that increases the volume of the liquid containing chamber to cause ejection of a droplet and has a pulse width of A times a time T required for a pressure wave to propagate in one way longitudinally through the liquid containing chamber, where A is a positive constant less than 1; and
only one additional pulse signal to be applied following the ejection pulse, the additional pulse signal increasing the volume of the liquid containing chamber to pull back a part of the droplet about to be ejected,
wherein the ejection pulse and the only one additional pulse signal generates a stable ejection of minute droplets.

22. The actuator control device according to claim 21, wherein the pulse generator generates, when a smallest volume of a droplet is determined by the droplet volume determining portion, the ejection pulse signal and the additional pulse signal on the basis of one of the waveform patterns corresponding to the smallest volume.

23. A method for controlling an actuator in an apparatus for ejecting droplets, the apparatus comprising a plurality of nozzles through which droplets are ejected, a plurality of liquid containing chambers each connected at one longitudinal end thereof with a corresponding nozzle, and an actuator that changes a volume of each of the liquid containing chambers,
the method comprising, with respect to a one-dot printing instruction, the steps of:
applying to the actuator an ejection pulse signal having a pulse width of A times a time T required for a pressure wave to propagate in one way longitudinally through the liquid containing chamber, where A is a positive constant less than 1, the ejection pulse signal increasing the volume of the liquid containing chamber to cause ejection of a droplet; and
applying to the actuator an additional pulse signal after the application of the ejection pulse signal, the additional pulse increasing the volume of the liquid containing chamber to pull back a part of the droplet about to be ejected,
wherein the ejection pulse and the only one additional pulse signal generates a stable ejection of minute droplets.

24. The method according to claim 23, wherein a time interval between a completion of an application of the ejection pulse signal and a start of an application of the additional pulse signal is B times the time T, where B is a positive constant; and a total value of the constants A and B is 1.15 to 1.38.

25. The method according to claim 24, wherein the total value of the constants A and B is 1.21 to 1.33.

26. The method according to claim 23, wherein a pulse width of the additional pulse signal is C times the time T, where C is a constant within 0.4 to 0.5.

27. The method according to claim 23, wherein the time T is 5 μsec or less.

* * * * *